(12) United States Patent
Kim (10) Patent No.: US 6,319,806 B1
(45) Date of Patent: Nov. 20, 2001

(54) INTEGRATED CIRCUIT WIRING AND FABRICATING METHOD THEREOF

(75) Inventor: Pil-Sung Kim, Cheongju (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/730,811

(22) Filed: Dec. 7, 2000

(30) Foreign Application Priority Data

Feb. 8, 2000 (KR) .................................................. 00-5760

(51) Int. Cl.$^7$ .................... H01L 21/3205; H01L 21/4763
(52) U.S. Cl. .................... 438/592; 438/592; 438/597; 438/649; 438/655; 438/682
(58) Field of Search .................... 438/592, 597, 438/649, 655, 656, 682, 683

(56) References Cited

U.S. PATENT DOCUMENTS

| | | | |
|---|---|---|---|
| 5,753,557 | * 5/1998 | Tseng | 438/303 |
| 5,946,578 | * 8/1999 | Fujii | 438/300 |
| 6,001,719 | * 12/1999 | Cho et al. | 438/592 |
| 6,040,241 | * 3/2000 | Lee et al. | 438/622 |
| 6,146,932 | * 11/2000 | Roh | 438/197 |
| 6,235,621 | * 5/2001 | Jeng et al. | 438/592 |

OTHER PUBLICATIONS

Chue–san Yoo, et al., "Si/W Ratio Changes and Film Peeling during Polycide Annealing," Japanese Journal of Applied Physics, vol. 29, No. 11, Nov., 1990, pp. 2535–2540.

S. G. Telford, et al., "Chemically Vapor Deposited Tungsten Silicide Films Using Dichlorosilane in a Single–Wafer Reactor," J. Electrochem. Soc., vol. 140, No. 12, Dec., 1993, pp. 3689–3701.

* cited by examiner

Primary Examiner—John F. Niebling
Assistant Examiner—Angel Roman
(74) Attorney, Agent, or Firm—Morgan, Lewis & Bockius LLP (57) ABSTRACT

The present invention relates to an integrated circuit wiring capable of reducing the contact resistance between lines and a fabricating method thereof. The wiring in accordance with the present invention includes a gate oxide film formed on the upper surface of a semiconductor device. A first line including a first silicon film pattern that is formed on an upper surface of the gate oxide film and has a certain width; and a silicide film pattern that is formed on the upper surface of the first silicon film and has a smaller width than that of the first silicon film pattern to thereby expose a certain region of the first silicon film pattern. A second line is formed to contact the silicide film pattern and the exposed certain region of the silicon film pattern.

11 Claims, 6 Drawing Sheets

INTEGRATED CIRCUIT WIRING AND FABRICATING METHOD THEREOF

This application claims the benefit of Korean Application No. 5760/2000, filed in Korea on Feb. 8, 2000, which is hereby incorporated by reference.

BACKGROUND OF THE INVENTION

1. Field of the Invention

The present invention relates to an integrated circuit wiring and a fabricating method thereof and in particular, to an integrated circuit wiring capable of reducing contact resistance between lines constituting the integrated circuit and a fabricating method thereof.

2. Description of the Background Art

As the density of an integrated device increases, the size of elements constituting the integrated device is decreased more and more. Accordingly, the sectional area of a line such as a word line and a bit line, which constitute the integrated device, also decreases, and thus the resistance of the line is increased. To solve this problem, a method of forming wiring using polycide with a stack structure of silicon and silicide has been employed recently.

Wiring using a silicide as a polycide has an excellent characteristics compared to wiring formed of silicon or metal. Silicide material has lower resistivity than silicon and exibits strong oxidation-resistance. Even when exposed to an oxygen atmosphere, only silicide material sufaces oxidize.

FIGS. 1A through 1H sequentially illustrate a conventional method of fabricating a word line and a bit line using polycide.

Figure 1A:
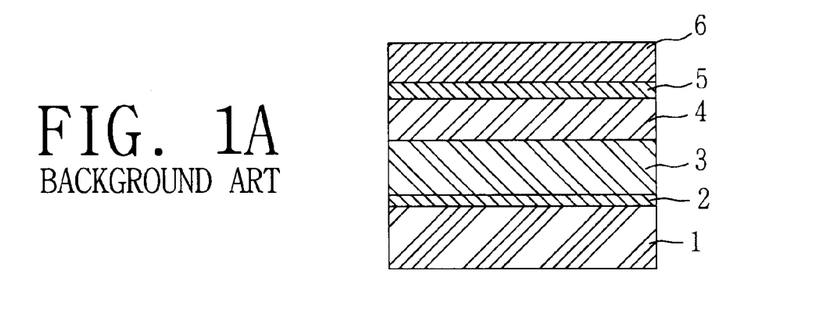
FIGS. 1A through 1H illustrate a sequential process of fabricating a word line and a bit line using polycide in the conventional art.

First, as shown in FIG. 1A, a gate oxide film 2, a doped first silicon film 3, a first silicide film 4, a silicon oxide film 5, and a first silicon nitride film 6 are sequentially deposited and stacked on the upper surface of a substantially single crystal semiconductor substrate 1. The first silicon film 3 is formed of polysilicon or amorphous silicon, and the first silicide film 4 is mostly formed of tungsten silicide ($WSi_x$). The silicon oxide film 5 is formed of $SiO_2$, and the first silicon nitride film 6 is formed of $Si_3N_4$.

Figure 1B:
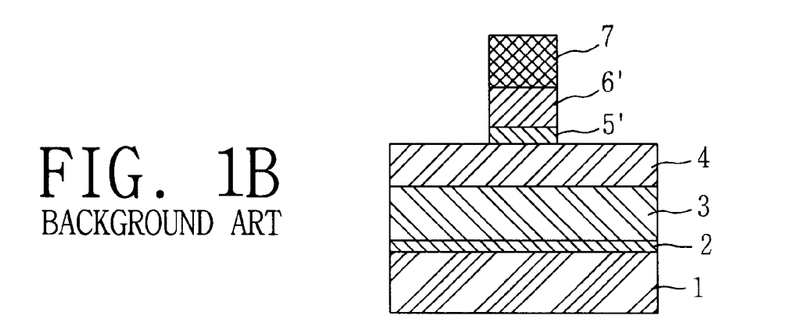

Next, as shown in FIG. 1B, a photoresist film (not shown) is applied on the upper surface of the first silicon nitride film 6 to thereafter form a first photoresist film pattern 7 by exposure and developing processes. Then, using the first photoresist film pattern 7 as a mask, a silicon nitride film 6' and a silicon oxide film pattern 5' are formed by sequentially patterning the first silicon nitride film 6 and the silicon oxide film 5.

Figure 1C:
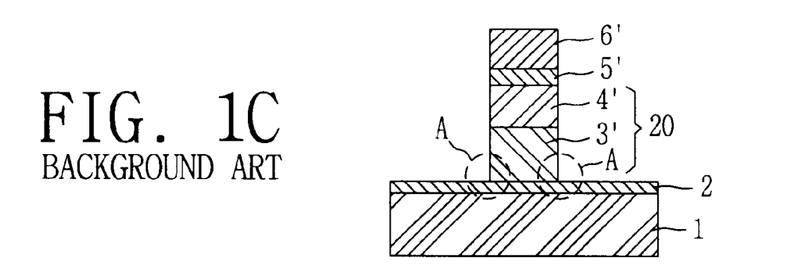

Next, as shown in FIG. 1C, the photoresist film 7 is removed. Then, using the silicon nitride film 6' and the silicon oxide film pattern 5' as a hard mask, a word line 20 formed of a first silicide film pattern 4' and a first silicon film pattern 3' is formed by sequentially patterning the first silicide film 4 and the first silicon film 3.

In the process of forming the first silicide film pattern 4' and the first silicon film pattern 3', etchant gas concentrates on part 'A' of FIG. 1C resulting in overetching a portion of the gate oxide in part 'A', thus damaging the gate oxide. Since this damage to the gate oxide film results in undesirable device characteristics, reoxidation is performed in an oxygen atmosphere to repair damage to the gate oxide film.

Taking the case where first silicide film pattern 4' is formed of tungsten silicide ($WSi_x$), for example, the grain size is about 300 Å at the initial stage of deposition. However, as crystallization of tungsten silicide proceeds after an annealing treatment, such as reoxidation or planation, grain size increases to about 700 Å~1200 Å. When silicon atoms are not properly provided in this process of crystallization, voids may occur between grains. (S. G. Telford et al., "Chemically Vapor Deposited Tungsten Silicide Films Using Dichlorosiane in a Single Wafer Reactor", vol. 140, No. 12, 1993, pp. 3689~3701). When tungsten silicide is so crystallized, a path forms where atoms easily diffuse through voids and grain boundaries between grains. The crystallization thus described can occur not only to tungsten silicide, but also to other kinds of silicide.

In addition, silicon in first silicide film pattern 4' has a high degree of oxidation compared to silicon in first silicon film pattern 3', resulting in oxidation of silicon located near surfaces of first silicide film pattern 4', thus forming an $SiO_2$ film on these surfaces. As the oxidation proceeds on the surfaces of first silicide film pattern 4', silicon located in first silicide film pattern 4' diffuses near surfaces of the film, resulting in silicon deficiency in first silicide film pattern 4'. (Chue-sang Yoo et al., "Si/W Ratio Changes and Film Peeling During Polycide Annealing," vol. 29, No. 11, 1990. pp.2535~2540). In order to compensate this deficiency, silicon atoms diffuse from first silicon film pattern 3' near first silicide film pattern 4' into first silicide film pattern 4' through the grain boundaries and voids. However, dopant atoms from first silicon film pattern 3' also diffuse into first silicide film pattern 4' through grain boundaries and voids. As the result, as shown in FIG. 1D, a dopant-depleted layer 8 is formed in first silicon film pattern 3' near first silicide film pattern 4'.

Figure 1D:
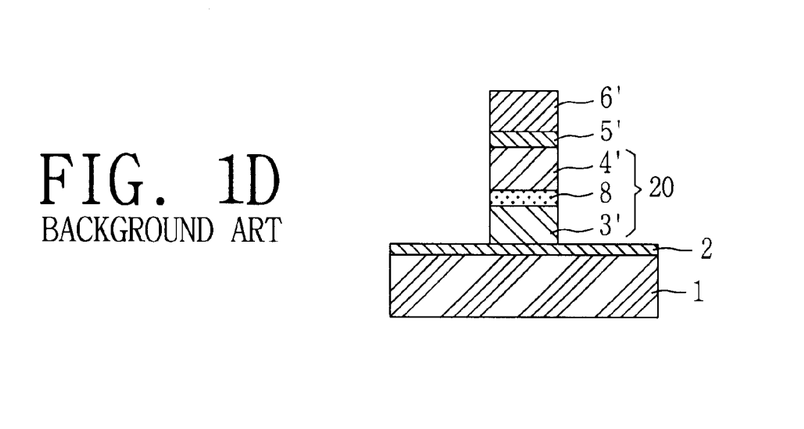
Figure 1E:
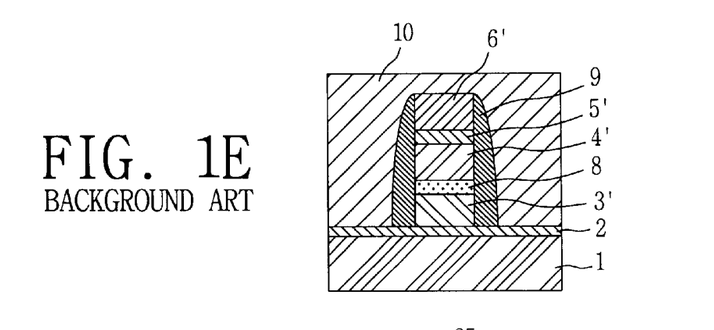

Next, as shown in FIG. 1E, a second silicon nitride film (not shown) is deposited on the upper surface of the entire structure as illustrated in FIG. 1D. Thereafter, anisotropic etching is performed to form a sidewall spacer 5' at both sides of word line 20, silicon oxide film pattern 5' and silicon nitride film pattern 6'. Then, an interlayer insulator film 10 is deposited so as to completely cover word line 20, silicon oxide film pattern 5, silicon nitride film pattern 6 and sidewall spacer 9.

Figure 1F:
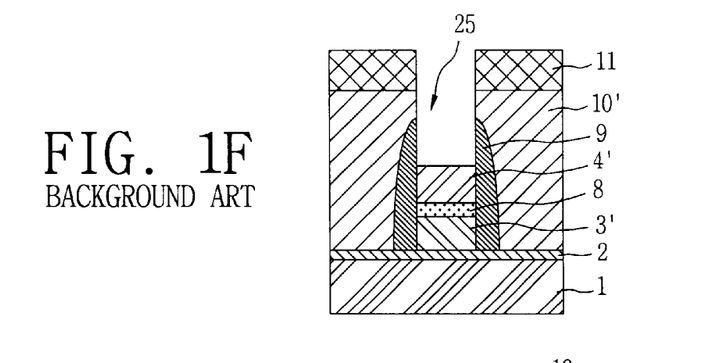

Next, as shown in FIG. 1F, a photoresist film (not shown) is coated on the upper surface of the interlayer insulator film 10. Thereafter, a second photoresist film pattern 11 is formed on insulator film 10 by exposure and developing processes. Then, using the second photoresist film pattern 11 as a mask, the interlayer insulator film 10, the silicon nitride film pattern 6' and the silicon oxide film pattern 5' are sequentially etched to form contact hole 25 exposing the upper surface of the first silicide film pattern 4' and an interlayer insulator film pattern 10'.

Figure 1G:
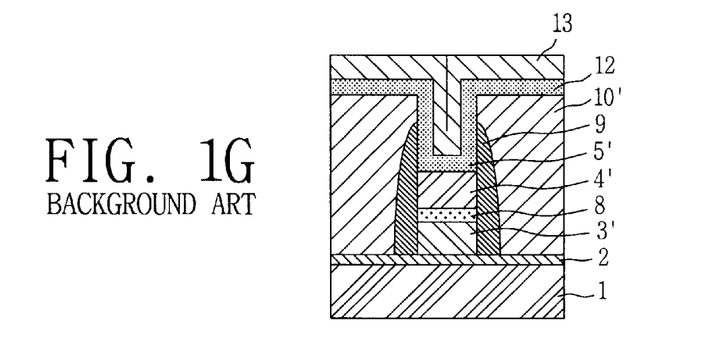

Next, as shown in FIG. 1G, the second photoresist film pattern 11 is removed. Doped second silicon film 12 and second silicide film 13 are then stacked on the upper surface of the interlayer insulator film pattern 10' and in contact hole 25 by sequentially depositing them.

Figure 1H:
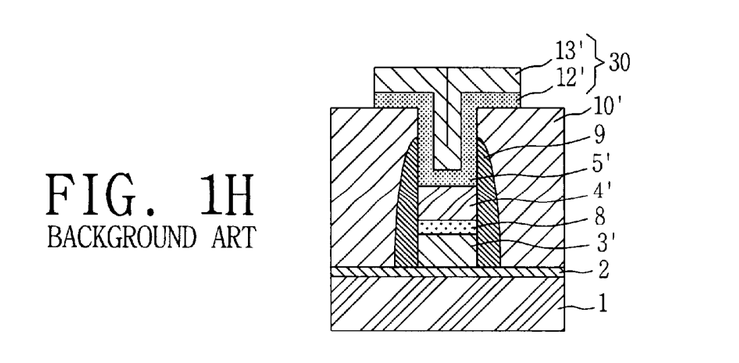

Next, as shown in FIG. 1H, a bit line is formed of a second silicide film pattern 13' and a second silicon film pattern 12' by patterning the second silicide film pattern 13 and the second silicon film 12.

In the conventional structure of a word line and a bit line using polycide thus described, the first silicide film pattern 4' constituting the word line and the second silicon film pattern 12' constituting the bit line are connected in series to contact each other. However, as described above, a dopant-depletion layer 8 is formed between the first silicon film pattern 3' and the first silicide film pattern 4'. Since the dopant-depleted layer 8 is a region with a small number of carriers flowing current, it has a high resistance, resulting in the increase of the contact resistance between the word line 20 and the bit line 30.

SUMMARY OF THE INVENTION

Accordingly, the present invention is directed to an integrated circuit line and method of manufacturing thereof that substantially obviates one or more of the problems due to limitations and disadvantages of the related art.

An aspect of the present invention is that low resistance contacts are provided on integrated circuit lines.

Another aspect of the present invention is that polycide is used to provide low resistance contact between a word line and a bit line.

A further aspect of the present invention is to provide a method of fabricating an integrated circuit line having low resistance contact.

Another further aspect of the present invention is to provide a method of fabricating a low resistance contact between a word line and a bit line.

Additional features of and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the integrated circuit wiring includes a word line including a first silicon film pattern and a first silicide film pattern formed on the first silicon pattern film, and a bit line in contact with both the first silicon film pattern and the first silicide film pattern.

In another aspect, an integrated circuit line includes a gate oxide film formed on an upper surface of a semiconductor substrate; a word line including a first silicon film pattern that is formed on an upper surface of the gate oxide film and has a certain width, and a first silicide film pattern that is formed on an upper surface of the first silicon film pattern, has a smaller width than the certain width, and thus exposes a certain region of the first silicon film pattern; and a bit line formed to be in contact with the exposed certain region of the first silicon film pattern.

In a further aspect, the fabricating method of integrated circuit wiring includes forming a gate oxide film on an upper surface of a semiconductor substrate, forming a first silicide film on an upper surface of the gate oxide film, forming a first silicide film pattern with a smaller width than that of the first silicon film pattern on an upper surface of the first silicon film pattern, and forming a bit line on the upper surface of the first silicon firm pattern and on an upper surface of the first silicide film pattern.

In another further aspect, the method of fabricating integrated circuit wiring includes forming a gate oxide film on an upper surface of a semiconductor substrate, forming a fist silicon film on an upper surface of the gate oxide film, forming a first silicide film on an upper surface of the first silicon film, forming a first silicon film pattern with a greater width than that of the first silicide film pattern by sequentially patterning the first silicide film and the first silicon film, performing reoxidation, forming an interlayer insulator film, forming a contact hole exposing the first silicon film pattern and the first silicide film pattern by patterning the interlayer insulator film, and forming a bit line on an upper surface of the interlayer insulator film and in the contact hole.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 2:
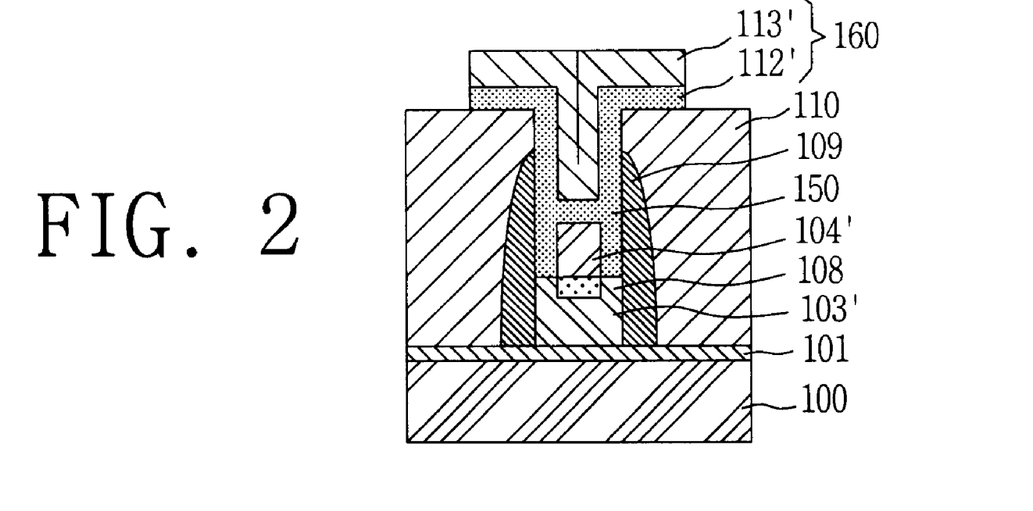
FIG. 2 is a vertical cross-sectional view illustrating a word line and a bit line using polycide in accordance with a first embodiment of the present invention.

FIG. 2 illustrates a vertical cross-sectional view of an integrated device with wiring of a word line and a bit line in accordance with a first embodiment of the present invention.

As shown therein, a gate oxide film 101 is formed on the upper surface of a semiconductor substrate 100 mostly formed of single crystal silicon. A doped first silicon film pattern 103' formed of polysilicon or amorphous silicon is formed in a certain region of the upper surface of the gate oxide film 101, and a first silicide film pattern 104' is formed in a certain region of the upper surface of the first silicon film pattern 103'. The first silicide film pattern 104' can be formed of at least one or more of a variety of silicide such as cobalt silicide, platinum silicide, molybdenum silicide, tungsten silicide, etc. However, in the present invention, the first silicide film pattern 104' is particularly formed of tungsten silicide. First silicide film pattern 104' has a smaller width than that of the first silicon film pattern 103', so that some regions of the first silicon film pattern are exposed. First silicon film pattern 103' and first silicide film pattern 104' form word line 150. A dopant-depleted layer 108 is formed in the first silicon film pattern 103' near the first silicide film pattern 104'. A bit line 160 formed by sequentially stacking the doped second silicon film pattern 112' and second silicide film pattern 113' is formed on the upper surface of word line 150. Second silicon film pattern 112' is formed of amorphous silicon or polysilicon, and the second silicide film pattern 113' is formed of at least one or more of the above-described variety of silicide. Bit line 160 is in contact with both first silicon film pattern 103' and first silicide film pattern 104' which form word line 150. The bit line can be formed of not only polycide, as described above, but also doped silicon or metal. A sidewall spacer 109 formed of insulating material is formed on a certain region at both sides of word line 150 and bit line 160. Sidewall spacer 109 is completely covered with an interlayer insulator film 110.

In another embodiment of the present invention, tungsten nitride ($WN_x$) film, titanium nitride (TiN) film, tantalum nitride (TaN) film, tungsten silicide ($W,Si_x$) film, etc. can be formed as a diffusion-resist film between the first silicon film pattern 103' and the first silicide film pattern 104'.

In yet another embodiment of the present invention, the first silicide film pattern 104' can be replaced by a metal film pattern (not shown) with a melting point of more than 800° C. such as titanium (Ti), cobalt (Co), molybdenum (Mo), tungsten (W), copper (Cu), and tantalum (Ta).

FIGS. 3A through 3I illustrate a fabricating method of wiring of a word line and a bit line in accordance with a first embodiment of the present invention.

Figure 3A:
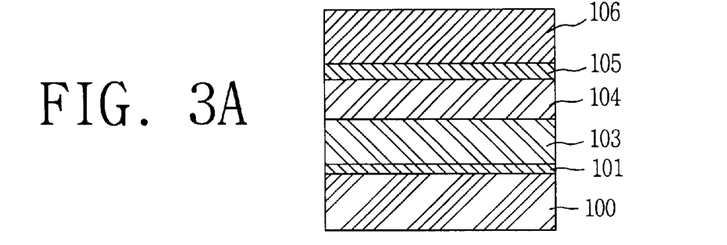
FIGS. 3A through 3I illustrate a sequential process of fabricating a word line and a bit line using polycide in accordance with a first embodiment of the present invention.

First, as shown in FIG. 3A, using hafnium (Hf) a native oxide film formed on the upper surface of a substantially single crystal semiconductor substrate 100 is removed. Thereafter, a gate oxide film 101 is formed on the upper surface of the semiconductor substrate 100. Gate oxide film 101 is formed by wet oxidation using hydrogen and oxygen, or by NO oxidation using NO gas or $N_2O$ gas. Then, a first silicon film 103 is formed on the upper surface of the gate oxide film 101 by a DCS (dichlorosilane) decomposition method using low pressure chemical vapor deposition (LPCVD). First silicon film 103 is formed of amorphous silicon in a case where the deposition temperature is less than 550° C., or polysilicon in a case where the deposition temperature is more than 550° C. Then, a first tungsten silicide film 104 is deposited on the upper surface of the first silicon film 103 by chemical vapor deposition (CVD) using a mixture of $SiH_4$ (or dichlorosilane) gas and $WF_6$ gas. The deposition of the first silicide film 104 is performed at a high temperature of 300° C.~700° C. Then, a silicon oxide film 105 and a first silicon nitride film 106 are stacked on the upper surface of the first silicide film 104 by low pressure chemical vapor deposition by sequentially depositing them thereon. The deposition of silicon oxide film 105 is performed by forming liquid TEOS (tetraethylorthosilicate) into a gaseous state through a bubbler, introducing the resultant TEOS into a chamber, and thermal-cracking it at a high temperature of 500~700° C. The deposition of the first silicon nitride film 106 is performed by reacting DCS (dichlorosilane) with $NH_3$ by using LPCVD.

Figure 3B:
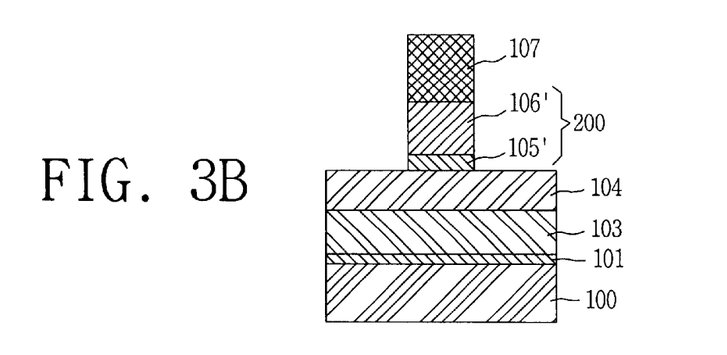

Next, as shown in FIG. 3B, a photoresist film (not shown) is coated on the upper surface of first silicon nitride film 106. Thereafter, a first photoresist film pattern 107 is formed on silicon nitride film 106 by exposure and developing processes. Then, using the first photoresist film pattern 107 as a mask, a capping insulator film 200 formed of a silicon nitride film pattern 106' and a silicon oxide film pattern 105' is formed by sequentially patterning the first silicon nitride film 106 and the silicon oxide film 105. Patterning of first silicon nitride film 106 and silicon oxide film 105 is performed by sequentially etching the films using physical and chemical reactions between polar ions formed by etchant gas, such as $CF_4$, $O_2$, etc. decomposing in a reactive ion etching (RIE) generated plasma.

Figure 3C:
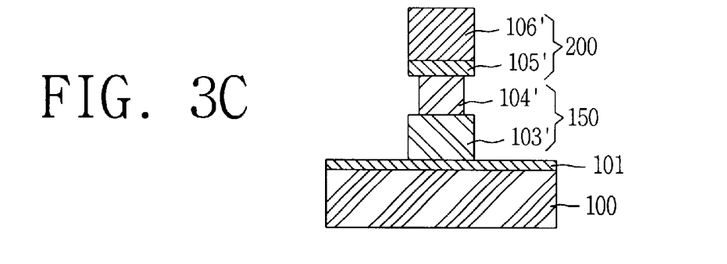

Next, as shown in FIG. 3C, the photoresist film pattern 107 is removed by ashing using oxygen plasma or ultraviolet. Thereafter, using the first silicon nitride film pattern 106' and the silicon oxide film pattern 105' as a hard mask, a word line 150 is formed from first silicide film pattern 104' and first silicon film pattern 103' by sequentially patterning the first silicide film 104 and the first silicon film 103.

At this time, the patterning of the first silicide film 104 is performed by using etchant gas including chlorine Cl. The patterning of the first silicon film 103 is performed at a low bias power of 0~80W by using etchant gas including chlorine and oxygen. During the patterning of the first silicon film 103 described above, if the bias power is not applied or applied a little, the straightness of the etchant gas is decreased as in isotropic etching. As a result, the first silicon film 103 and the sides of the first silicide film 103 are etched at the same time by using chlorine included in the etchant gas. Moreover, oxygen included in the etchant gas increases the etching speed at the sides of the first silicide film pattern 104'. As a result, as shown in FIG. 3C, the width of the first silicide film pattern 104' becomes smaller than that of the first silicon film pattern 103'. Oxygen can also be included in the etchant gas in order to increase the etching speed when first silicon film 104 is patterned.

Figure 3D:
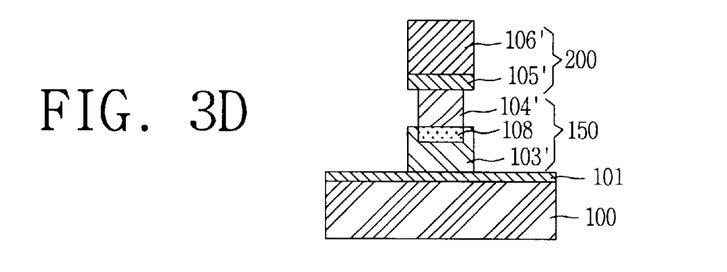

Next, as shown in FIG. 3D, reoxidation is performed in order to repair the damage to gate oxide film 101 due to overetching, which is generated during the patterning of first silicide film 104 and first silicon film 103. The reoxidation is performed for about 30 minutes at oxygen atmosphere and at a temperature of 800~1000° C. In the process of reoxidation, for the reason as described in the conventional art, a dopant-depleted layer 108 is formed in first silicon film pattern 103' near first silicide film pattern 104'.

Figure 3E:
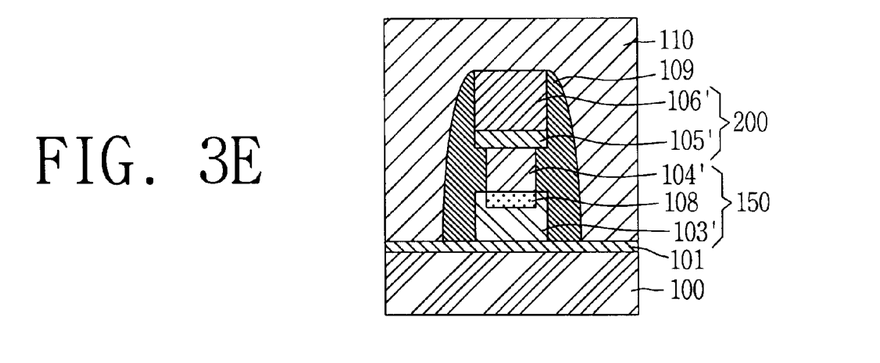
Figure 3F:
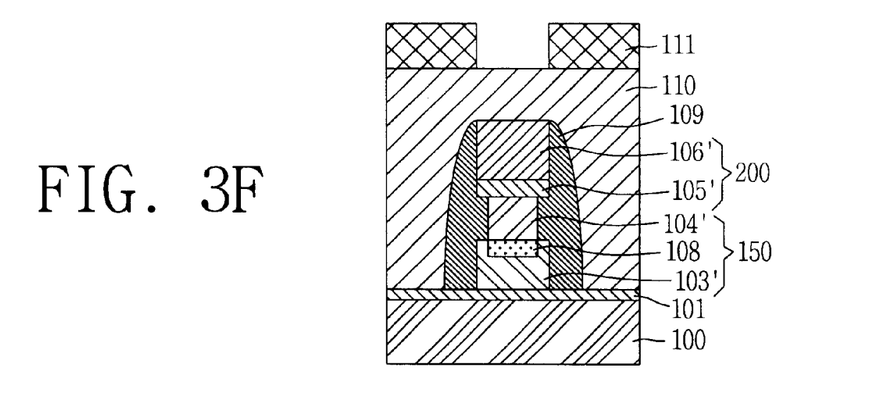

Next, as shown in FIG. 3E, a second silicon nitride film (not shown) is deposited on the upper surface of the entire structure as shown in FIG. 3D by reacting DCS with $NH_3$ using low pressure vapor deposition. Thereafter, anisotropic etching is performed to form a sidewall spacer 109 at both sides of word line 150, silicon oxide film pattern 105 and silicon nitride film pattern 106'. Then, using sidewall spacer 109 and word line 150 as a mask, dopant is introduced into semiconductor substrate 100 to thereby form source/drain regions (not shown). Then, an interlayer insulator film 110 is formed so that it can completely cover word line 150, silicon oxide film pattern 105', nitride film pattern 106', and sidewall spacer 109. Interlayer insulator film 110 is formed by depositing a silicon oxide film such as BPSG (boron phosphorus silicon glass) or USG (undoped silicon glass) and then performing a planation in a nitrogen atmosphere and at a temperature of 700~900° C.

Figure 3G:
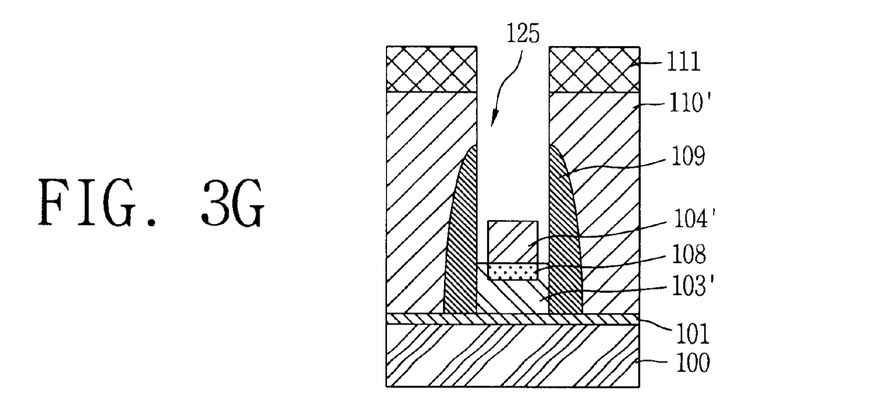

Next, as shown in FIG. 3G, using second photoresist film pattern 111 as a mask, silicon nitride film pattern 106' and silicon oxide film pattern 105' are sequentially etched by reactive ion etching to form a contact hole 125 and an interlayer insulator film pattern 110' exposing some portions of the upper surface of first silicon film pattern 103'.

Figure 3H:
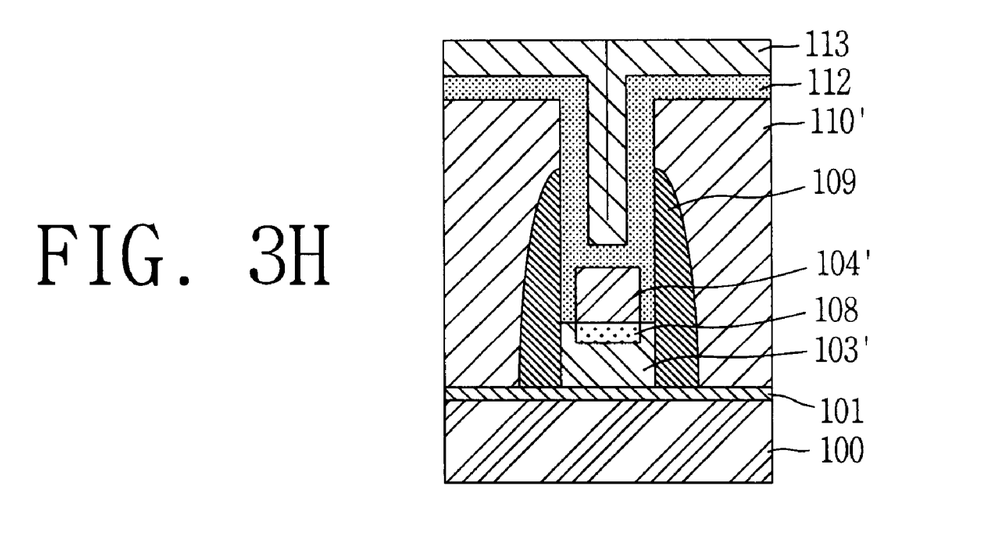

Next, as shown in FIG. 3H, second photoresist film pattern 111 is removed by etching using oxygen plasma and ultraviolet. Thereafter, a doped second silicon film 112 and a second silicide film 113 are deposited in a stacked fashion on the upper surface of interlayer insulator film pattern 110' and in contact hole 125. At this time, second silicon film 112 is in contact with first silicon film pattern 103' as well as first silicide film pattern 104'.

Figure 3I:
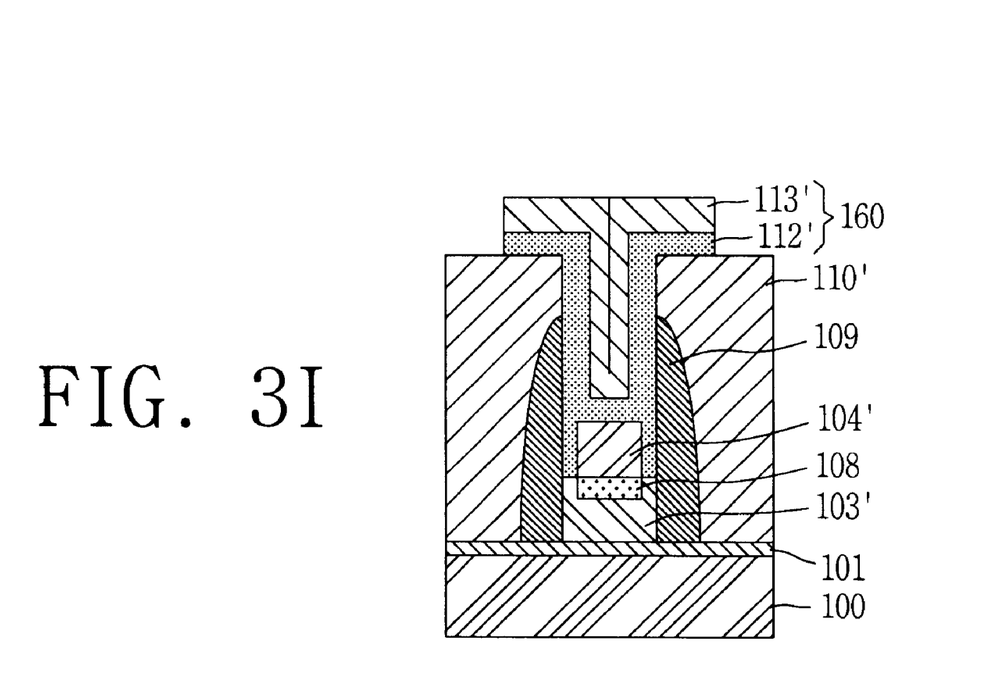

Next, as shown in FIG. 3I, second silicide film 113 and second silicon film 112 are patterned to form a bit line 160 formed of a second silicide film pattern 113' and a second silicon film pattern 112'. Bit line 160 is in contact with first silicide film pattern 104' and first silicon film pattern 103' at the same time.

In the integrated circuit wiring and the fabricating method thereof in accordance with the present invention thus described, a bit line is in contact with a word line formed by both a silicon film pattern and a silicide film pattern, and in such a way that contact resistance between the word line and the bit line can be decreased even when a dopant-depleted layer formed during reoxidation has a large resistance.

In addition to reducing contact resistance between integrated circuit lines, reoxidation can be performed while practicing the present invention to repair damage to a gate oxide film due to overetching, thus preventing deterioration of device characteristics caused by the damage.

It will be apparent to those skilled in the art that various modifications and variations can be made in the integrated circuit line and manufacturing method thereof of the present invention without departing from the spirit or scope of the invention. Thus, it is intended that the present invention cover the modifications and variations of this invention provided they come within the scope of the appended claims and their equivalents.

What is claimed is:

1. A method of fabricating an integrated circuit wiring, comprising the steps of:

forming a gate oxide film on an upper surface of a semiconductor substrate;

forming a first silicon film pattern on an upper surface of the gate oxide film;

forming a first silicide film pattern with a smaller width than that of the first silicon film pattern on an upper surface of the first silicon film pattern; and forming a bit line on the upper surface of the first silicon film pattern and an upper surface of the first silicide film pattern.

2. The method of claim 1, wherein the bit line is formed by sequentially stacking a second silicon film and a second silicide film and patterning them.

3. A method of fabricating an integrated circuit wiring, comprising the steps of:

forming a gate oxide film on an upper surface of a semiconductor substrate;

forming a first silicon film on an upper surface of the gate oxide film;

forming a first silicide film on an upper surface of the first silicon film;

forming a first silicide film pattern and a first silicon film pattern with a greater width than that of the first silicide film pattern by sequentially patterning the first silicide film and the first silicon film performing reoxidation;

forming an interlayer insulator film;

forming a contact hole exposing the first silicon film pattern and the first silicide film pattern by patterning the interlayer insulator film; and forming a bit line on an upper surface of the interlayer insulator film and in the contact hole.

4. The method of claim 3, wherein the patterning of the first silicon film and the first silicide film comprises the steps of:

patterning the first silicide film by using gas including chlorine; and patterning the first silicon film by using gas including chlorine and oxygen.

5. The method of claim 4, wherein, in the step of patterning the first silicon film, the sides of the first silicide film pattern are etched.

6. The method of claim 4, wherein, in the step of patterning the first silicon film, the bias power of an etching apparatus is 0~80W.

7. The method of claim 3, wherein the gate oxide film is formed by wet oxidation or NO oxidation.

8. The method of claim 3, wherein the first silicon film is formed by DCS (dichlorosilane) decomposition.

9. The method of claim 8, wherein the first silicon film is formed of amorphous silicon or polysilicon.

10. The method of claim 3, wherein the first silicide film is formed by chemical vapor deposition (CVD) using a mixture of $SiH_4$ (or dichlorosilane) gas and $WF_6$ gas.

11. The method of claim 10, wherein the first silicide film is formed at a temperature of 300° C.~700° C.

* * * * *